(12) United States Patent
Fuchs et al.

(10) Patent No.: US 12,265,273 B2
(45) Date of Patent: Apr. 1, 2025

(54) ASSEMBLING CUSTOM DESIGN MODULAR DATA CENTER CABINET LAYOUT FOR ELECTRONIC DEVICES

(71) Applicant: Kyndryl, Inc., New York, NY (US)

(72) Inventors: Jeffrey Fuchs, Durham, NC (US); Brian Tesar, Durham, NC (US); Stephen B Porter, Mount Kisco, NY (US)

(73) Assignee: Kyndryl, Inc., Armonk, NY (US)

( * ) Notice: Subject to any disclaimer, the term of this patent is extended or adjusted under 35 U.S.C. 154(b) by 1015 days.

(21) Appl. No.: 17/086,199

(22) Filed: Oct. 30, 2020

(65) Prior Publication Data
US 2022/0141986 A1    May 5, 2022

(51) Int. Cl.
*H02G 1/00*     (2006.01)
*G02B 6/44*     (2006.01)
(Continued)

(52) U.S. Cl.
CPC ............ *G02B 6/4452* (2013.01); *H02G 1/00* (2013.01); *H02G 3/00* (2013.01); *G11B 33/127* (2013.01); *H05K 7/1488* (2013.01)

(58) Field of Classification Search
CPC ............ G02B 6/4452; G02B 6/44524; G02B 6/44526; G11B 33/127; H02G 1/00; H02G 3/00
See application file for complete search history.

(56) References Cited

U.S. PATENT DOCUMENTS 6,866,541 B2    3/2005    Barker
7,515,427 B2 *  4/2009    King, Jr. ............. G11B 33/127
                                              361/725
(Continued)

FOREIGN PATENT DOCUMENTS

JP         2014197043 A  * 10/2014

OTHER PUBLICATIONS

Downie et al., "RFID tag readability for tracking fiber optic connections in Data Centers," 2011 IEEE International Conference on RFID—Technologies and Applications, Sitges, Spain, 2011, pp. 230-235. (Year: 2011).*

(Continued)

*Primary Examiner* — A. Dexter Tugbang
(74) *Attorney, Agent, or Firm* — CANTOR COLBURN LLP; Erik Swanson

(57) ABSTRACT

A central electrical cabinet unit is designed and assembled as a pre-assembled unit for installation at a client site for designing/building a custom electronic data center cabinet design or layout. The pre-assembled unit includes a central patch panel in a central cabinet for electronic devices. The central patch panel includes specified connections for components using the specified connections. Central patch panel connecting cables with central patch panel connectors include reciprocal connectors are connectible to client specified connections in a client cabinet. Power cables and electrical cables have electrical connections to the central patch panel. The electrical cables are configured to have reciprocal connectors connectable to compatible client electrical connectors on client electrical cables in the client cabinet, thereby the central patch panels in the central cabinet are a pre-assembled unit for installation at a client site and for connecting client cabinets thereto.

1 Claim, 5 Drawing Sheets

(51) Int. Cl.
  *H02G 3/00* (2006.01)
  *G11B 33/12* (2006.01)
  *H05K 7/14* (2006.01)

(56) References Cited

U.S. PATENT DOCUMENTS

| | | | |
|---|---|---|---|
| 8,643,476 B2 | 2/2014 | Pinn | |
| 9,832,904 B1* | 11/2017 | Giroux | G02B 6/4452 |
| 9,846,291 B2 | 12/2017 | Montgelas | |
| 10,516,580 B2 | 12/2019 | Doorhy | |
| 2008/0023212 A1 | 1/2008 | Larsen | |
| 2009/0273915 A1* | 11/2009 | Dean, Jr. | G02B 6/44526 |
| | | | 361/826 |
| 2013/0330043 A1* | 12/2013 | Goldsmith | G02B 6/4452 |
| | | | 385/70 |
| 2016/0076265 A1 | 3/2016 | Parizeau | |
| 2018/0335595 A1* | 11/2018 | Takeuchi | G02B 6/4452 |

OTHER PUBLICATIONS

"Prefabricated Data Centers as a Global Trend", Delta, Technical Article, © Delta Power Solutions 2020, 5 pages, <https://www.deltapowersolutions.com/en/mcis/technical-article-prefabricated-data-centers-as-a-global-trend.php>.

IBM®, "RTP 9710 Upgrade", Cisco 9170 Director Cabling—v7 Cloud Optimized Design, presented Dec. 31, 2019, 19 pages, Evidence of Grace Period Disclosure.

Roy, et al., "Cloud-Enabled Data Center Organization using K-D Tree", International Journal of Database Theory and Application, vol. 8, No. 3, (2015), pp. 69-76, <https://www.researchgate.net/publication/279447042_Cloud-Enabled_Data_Center_Organization_using_K-D_Tree>.

* cited by examiner

ASSEMBLING CUSTOM DESIGN MODULAR DATA CENTER CABINET LAYOUT FOR ELECTRONIC DEVICES

STATEMENT REGARDING PRIOR DISCLOSURES BY THE INVENTOR OR A JOINT INVENTOR

The following disclosure(s) are submitted under 35 U.S.C. 102(b)(1)(A): DISCLOSURE(S): Dec. 31, 2019, including document titled: RTP 9710 Upgrade.

BACKGROUND

The present disclosure relates to techniques for providing custom data center cabinet design and delivery, and more specifically, modular custom data center cabinet design for electronic devices, which can be delivered to a client data center.

Typically, a custom design and delivery of data center cabinets can involve design cycles and cost quotes for development, delivery and assembly at a client location, i.e., data center. Such design cycles can be lengthy, and thereby costly, and labor intensive. Also, cost quotes for such design and delivery can be inaccurate as, for example, each custom design has unique features.

For example, client installation of cabinets for electronic devices can be custom built on site. Each cable length can be measured and custom ordered. Groups of cables can be labeled and bundled together on site. Cables can then be run under a data center floor and appropriate connections made. This process can be labor intensive, and subject to error due to mislabel of cables. Cabinets have the potential to be overloaded with equipment and/or power demand as additional cables can be added without limit.

These shortcomings can result in a custom design, delivery, and assembly of data center cabinets at a client location, which is costly, time consuming, and inefficient.

SUMMARY

The present disclosure recognizes the shortcomings and problems associated with current techniques assembling electrical cabinet units in a data center, for instance at a client location.

The present invention provides a method for assembling a central electrical cabinet unit for installation as a pre-assembled unit at a client site for designing/building a custom electronic data center cabinet design or layout.

The present invention solves the problems of lengthy design cycles and inaccurate quote development for a custom client data center cabinet delivery. Using the techniques of the present invention, a custom client data center cabinet delivery can be provided without a length design cycle and with accurate cost quotes, thus providing competitive bidding and timely delivery.

In one aspect according to the present invention, a method for assembling a central electrical cabinet unit for installation as a pre-assembled unit at a client site for designing/building a custom electronic data center cabinet design or layout comprising, assembling a central patch panel in a cabinet for electronic devices. The central patch panel including specified connections for components using the specified connections. The method includes installing central patch panel connecting cables with central patch panel connectors including reciprocal connectors connectible to client specified connections of respective client specified connection cables in a client cabinet. The method including installing power cables and electrical cables with electrical connections to the central patch panel. The method including configuring the electrical cables to have reciprocal connectors connectable to compatible client electrical connectors on client electrical cables in the client cabinet. Thereby, the central patch panels in the cabinet are a pre-assembled unit for installation at a client site and for connecting client cabinets thereto.

In a related aspect, the method can further include assembling a number of client cabinets for electronic devices by installing one or more client patch panels at a top area of each of the number of client cabinets. The method further includes installing, in each of the client cabinets, client specified connecting cables with the client specified connections, respectively, being connectible to the reciprocal connections of the connecting cables of the central patch panel. The method includes installing, in each of the client cabinets, the client electrical cables with the compatible client electrical connectors being electrically connectable to the reciprocal connectors of the electrical cables connected to the central patch panel.

In a related aspect, the method can further include assembling a plurality of central patch panels in the central cabinet. The plurality of central patch panels can include a first patch panel including a first specified connection for components using the first specified connection, and a second specified connection for components using the second specified connection. The method can include installing central patch panel connecting cables with central patch panel connectors for the first specified connection and for the second specified connection, and the central patch panel connectors including reciprocal connectors connectible to a client first specified connection and a client second specified connection in a client cabinet.

In a related aspect, the method can further include assembling a plurality of central patch panels in the central cabinet. The plurality of central patch panels can include a first patch panel including a fiber connection for components using fiber transmission, and a second patch panel including a copper connection for components using copper transmission. The method can include installing central patch panel connecting cables with central patch panel connectors for the fiber connection and for the copper connection, and the central patch panel connectors including reciprocal connectors connectible to a client fiber connection and client copper connection in a client cabinet.

In a related aspect, the method can further include assembling a number of client cabinets for electronic devices. The client cabinets can have the client specified connection cables with the client specified connections, respectively, being connectable to the reciprocal connectors of the central patch panel. And, the client cabinets can have the client electrical cables with the client electrical connectors being electrically connectable to the reciprocal connectors of the central patch panel.

In a related aspect, the method can further include installing client patch panels at a top area of each of the number of client cabinets. The client patch panels can include a fiber patch panel including fiber connections for components using fiber transmission, and a copper patch panel including copper connections for components using components using copper transmission. Each of the client patch panels can include reciprocal electrical transmission cables being connectable to the reciprocal connectors of the central path panel connectors in the central cabinet.

In a related aspect, the method can further include installing the central patch panels in pairs including a first set of central patch panels for fiber connections for components using fiber transmission, and a second set of central panels for copper connections for components using copper transmission. The method can include installing central patch panel connecting cables with central patch panel connectors including reciprocal connectors connectible to a client fiber connection and a client copper connection in a client cabinet.

In a related aspect, the method can include assembling a number of client cabinets for electronic devices. The method can include client cabinets having electrical cables with connectors being electrically connectable to the reciprocal connectors of the central cabinet. The method can include installing a set of client patch panels at a top area of each of the client cabinets. The set of the client patch panels can include a fiber patch panel for components using fiber transmission, and a copper patch panel for components using components using copper transmission. Each of the set of client patch panels can include reciprocal electrical transmission cables being connectable to the reciprocal connectors of the central path panel connectors in the central cabinet.

In a related aspect, the method can further include installing the central cabinet at a client site, and installing the client cabinets in proximity to the central cabinet. The method can include electrically connecting the client cabinets to the central cabinet.

In a related aspect, the method can further include installing, in the one or more client patch panels, electrical power cables with connections connectable to an on-site power source.

In a related aspect, the assembled central electrical cabinet unit can be a pre-assembled unit for installation at the client site for designing/building the custom electronic data center cabinet design or layout. Thereby, the method implements a geographically dispersed cloud optimized design, wherein the central patch panel cabinet has cables and power strips pre-installed, and the central patch panel cabinet has multiple central patch panels. The method further includes custom labeling and mounting cables to the central patch panel cabinet, and designating a network central patch panel of the multiple central patch panels. The method includes designating a SAN (storage area network) central patch panel of the multiple central patch panels, and providing two rows of cabinets. The method includes defining a number of cabinets in each row up to eight client cabinets, and including the network central patch panel in a first row of cabinets. The method further includes including the SAN central patch panel in a designated row of cabinets, and preinstalling, in the number of the client cabinets, two top of the cabinet patch panels to support up to 48 copper connections back to the network central patch panel of the central patch panel cabinet and 48 fiber connections back to the SAN central patch panel of the central patch panel cabinet. Thereby providing a unique geographically dispersed cloud optimized design central patch panel which enables clients to have low density equipment in one area and high-density equipment in another area.

In another aspect according to the present invention, an apparatus can include a pre-assembled central electrical cabinet unit for installation at a client site for designing/building a custom electronic data center cabinet design or layout. The apparatus can include a central patch panel in a central cabinet for electronic devices, and the central patch panel can include specified connections for components using the specified connections. The apparatus can include central patch panel connecting cables with central patch panel connectors including reciprocal connectors connectible to client specified connections in a client cabinet. The apparatus can include power cables and electrical cables with electrical connections to the central patch panel. The apparatus can include the electrical cables having reciprocal connectors connectable to compatible client electrical connectors on client electrical cables in the client cabinet. Thereby, the apparatus provides the central patch panels in the central cabinet as a pre-assembled unit for installation at a client site and for connecting client cabinets thereto.

In a related aspect, the apparatus can include a number of client cabinets for electronic devices including one or more client patch panels at a top area of each of the number of client cabinets. The apparatus includes, in each of the client cabinets, client specified connecting cables with the client specified connections, respectively, are connectible to the reciprocal connections of the connecting cables of the central patch panel. In each of the client cabinets, the client electrical cables with the compatible client electrical connectors are electrically connectable to the reciprocal connectors of the electrical cables connected to the central patch panel.

In a related aspect, the apparatus further can include a plurality of central patch panels. The plurality of central patch panels can include a first patch panel including a specified connection for components using the first specified connection, and a second specified connection for components using the second specified connection. The apparatus can include central patch panel connecting cables with central patch panel connectors including reciprocal connectors connectible to a client first specified connections and a client second specified connections in a client cabinet.

In a related aspect, the apparatus can include a plurality of central patch panels. The plurality of central patch panels can include a first patch panel including a fiber connection for components using fiber transmission, and a second patch panel including copper connections for components using copper transmission. The apparatus can include central patch panel connecting cables with central patch panel connectors including reciprocal connectors connectible to a client fiber connection and client copper connection in a client cabinet.

In a related aspect, the apparatus can include a number of client cabinets for electronic devices. The client cabinets can have electrical cables with connectors being electrically connectable to the reciprocal connectors of the central cabinet. The apparatus can include one or more client patch panels at a top area of each of the one or more client cabinets, and the client patch panels can include a fiber patch panel including fiber connections for components using fiber transmission, and a copper patch panel including copper connections for components using components using copper transmission. Each of the client patch panels can include reciprocal electrical transmission cables being connectable to the reciprocal connectors of the central path panel connectors in the central cabinet.

In a related aspect, the apparatus can include the central patch panels in pairs including a first set of central patch panels for fiber connections for components using fiber transmission, and a second set of central panels for copper connections for components using copper transmission. The apparatus can include central patch panel connecting cables with central patch panel connectors including reciprocal connectors connectible to a client fiber connection and client copper connection in a client cabinet.

In a related aspect, the apparatus can include a number of client cabinets for electronic devices, and the client cabinets can have electrical cables with connectors being electrically connectable to the reciprocal connectors of the central cabinet. The apparatus can include a set of client patch panels at a top area of each of the client cabinets, and the set of the client patch panels can include a fiber patch panel for components using fiber transmission, and a copper patch panel for components using components using copper transmission. Each of the set of client patch panels can include reciprocal electrical transmission cables being connectable to the reciprocal connectors of the central path panel connectors in the central cabinet.

In another aspect according to the present invention, a system can include a pre-assembled central electrical cabinet unit for installation at a client site for designing/building a custom electronic data center cabinet design or layout, which comprises a central patch panel in a central cabinet for electronic devices, and the central patch panel can include specified connections for components using the specified connections. The system can include central patch panel connecting cables with central patch panel connectors including reciprocal connectors connectible to client specified connections in a client cabinet, and the system can include power cables and electrical cables with electrical connections to the central patch panel. The system can include the electrical cables having reciprocal connectors connectable to compatible client electrical connectors on client electrical cables in the client cabinet. Thereby, the central patch panels in the central cabinet are a pre-assembled unit for installation at a client site and for connecting client cabinets thereto. The system can include a number of client cabinets for electronic devices, the client cabinets having electrical cables with connectors being electrically connectable to the reciprocal connectors of the central cabinet. The system can include one or more client patch panels at a top area of each of the one or more client cabinets, and the client patch panels can include specified connections for components using the specified connections. Each of the one or more client patch panels can include electrical transmission cables having reciprocal electrical connections being connectable to the reciprocal connectors of the central path panel connectors in the central cabinet.

In a related aspect the system can further include a plurality of central patch panels. The system includes the plurality of central patch panels including a first patch panel including a specified connection for components using the first specified connection and a second specified connection for components using the second specified connection. The system can include central patch panel connecting cables with central patch panel connectors including reciprocal connectors connectible to a client first specified connections and a client second specified connections in a client cabinet.

In another aspect according to the present invention, a kit can include a pre-assembled central electrical cabinet unit for installation at a client site for designing/building a custom electronic data center cabinet design or layout including a central patch panel in a central cabinet for electronic devices, and the central patch panel can include specified connections for components using the specified connections. The kit includes central patch panel connecting cables with central patch panel connectors including reciprocal connectors connectible to client specified connections in a client cabinet, and power cables and electrical cables with electrical connections to the central patch panel. The kit includes the electrical cables having reciprocal connectors connectable to compatible client electrical connectors on client electrical cables in the client cabinet, and thereby the central patch panels in the central cabinet are a pre-assembled unit for installation at a client site and for connecting client cabinets thereto. The kit includes a number of client cabinets for electronic devices, and the client cabinets can have electrical cables with connectors being electrically connectable to the reciprocal connectors of the central cabinet. The kit includes one or more client patch panels at a top area of each of the one or more client cabinets, and the client patch panels can include specified connections for components using the specified connections. Each of the one or more client patch panels can include electrical transmission cables having reciprocal electrical connections being connectable to the reciprocal connectors of the central path panel connectors in the central cabinet.

BRIEF DESCRIPTION OF THE SEVERAL VIEWS OF THE DRAWINGS

These and other objects, features and advantages of the present invention will become apparent from the following detailed description of illustrative embodiments thereof, which is to be read in connection with the accompanying drawings. The various features of the drawings are not to scale as the illustrations are for clarity in facilitating one skilled in the art in understanding the invention in conjunction with the detailed description. The drawings are discussed forthwith below.

DETAILED DESCRIPTION

The following description with reference to the accompanying drawings is provided to assist in a comprehensive understanding of exemplary embodiments of the invention as defined by the claims and their equivalents. The description includes various specific details to assist in that understanding, but these are to be regarded as merely exemplary, and assist in providing clarity and conciseness. Accordingly, those of ordinary skill in the art will recognize that various changes and modifications of the embodiments described herein can be made without departing from the scope and spirit of the invention. In addition, descriptions of well-known functions and constructions may be omitted.

The terms and words used in the following description and claims are not limited to the bibliographical meanings, but, are merely used to enable a clear and consistent understanding of the invention. Accordingly, it should be apparent to those skilled in the art that the following description of exemplary embodiments of the present invention is provided for illustration purpose only and not for the purpose of limiting the invention as defined by the appended claims and their equivalents.

It is to be understood that the singular forms "a," "an," and "the" include plural referents unless the context clearly dictates otherwise. Thus, for example, reference to "a component surface" includes reference to one or more of such surfaces unless the context clearly dictates otherwise.

EMBODIMENTS AND EXAMPLES

Figure 1:
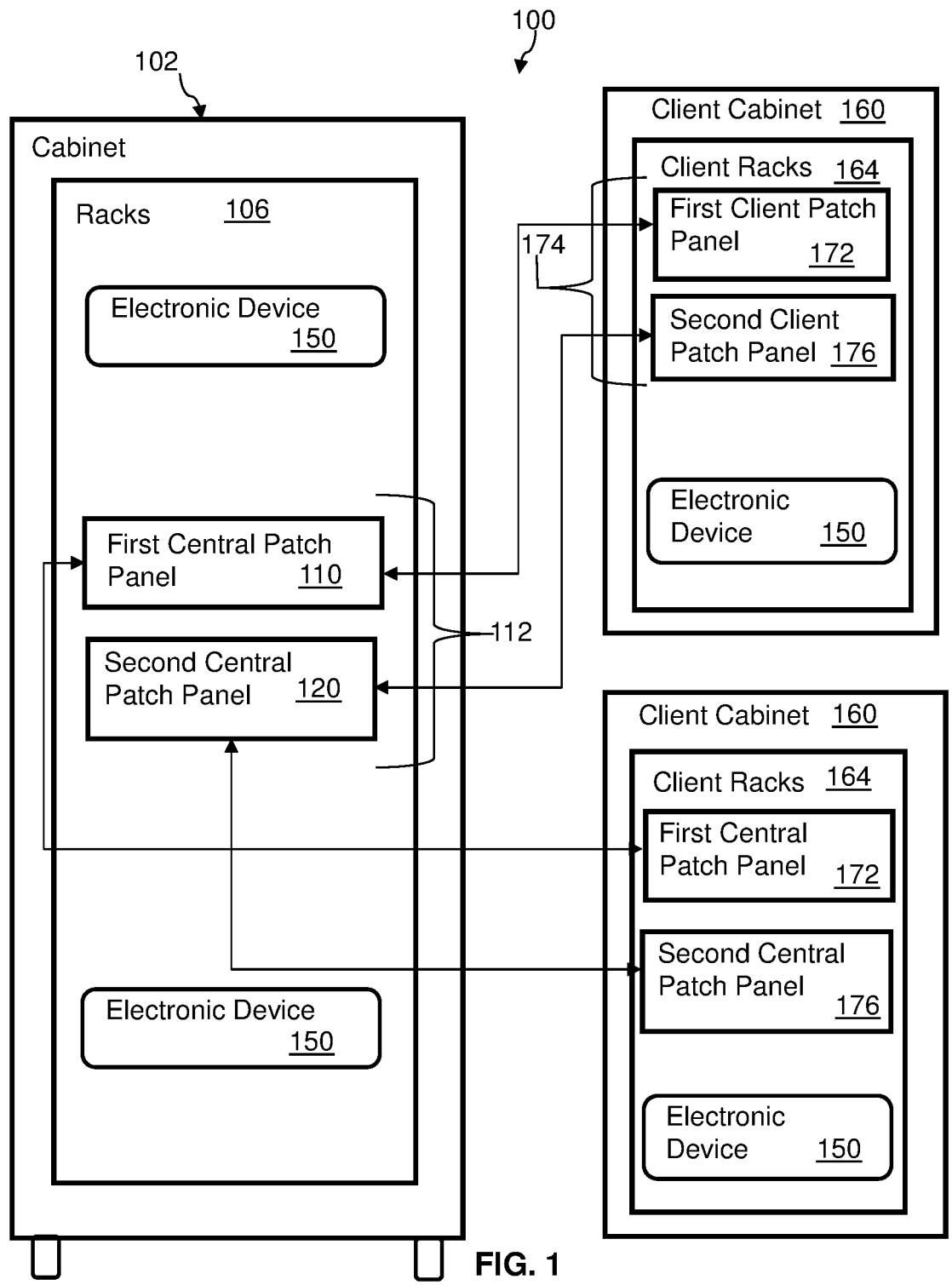
FIG. 1 is a front elevational view of a custom electronic data center cabinet layout as a system including system features or components, for assembling a central electrical cabinet unit for installation as a pre-assembled unit at a client site for designing/building a custom electronic data center cabinet design or layout, according to an embodiment of the present disclosure.
Figure 2:
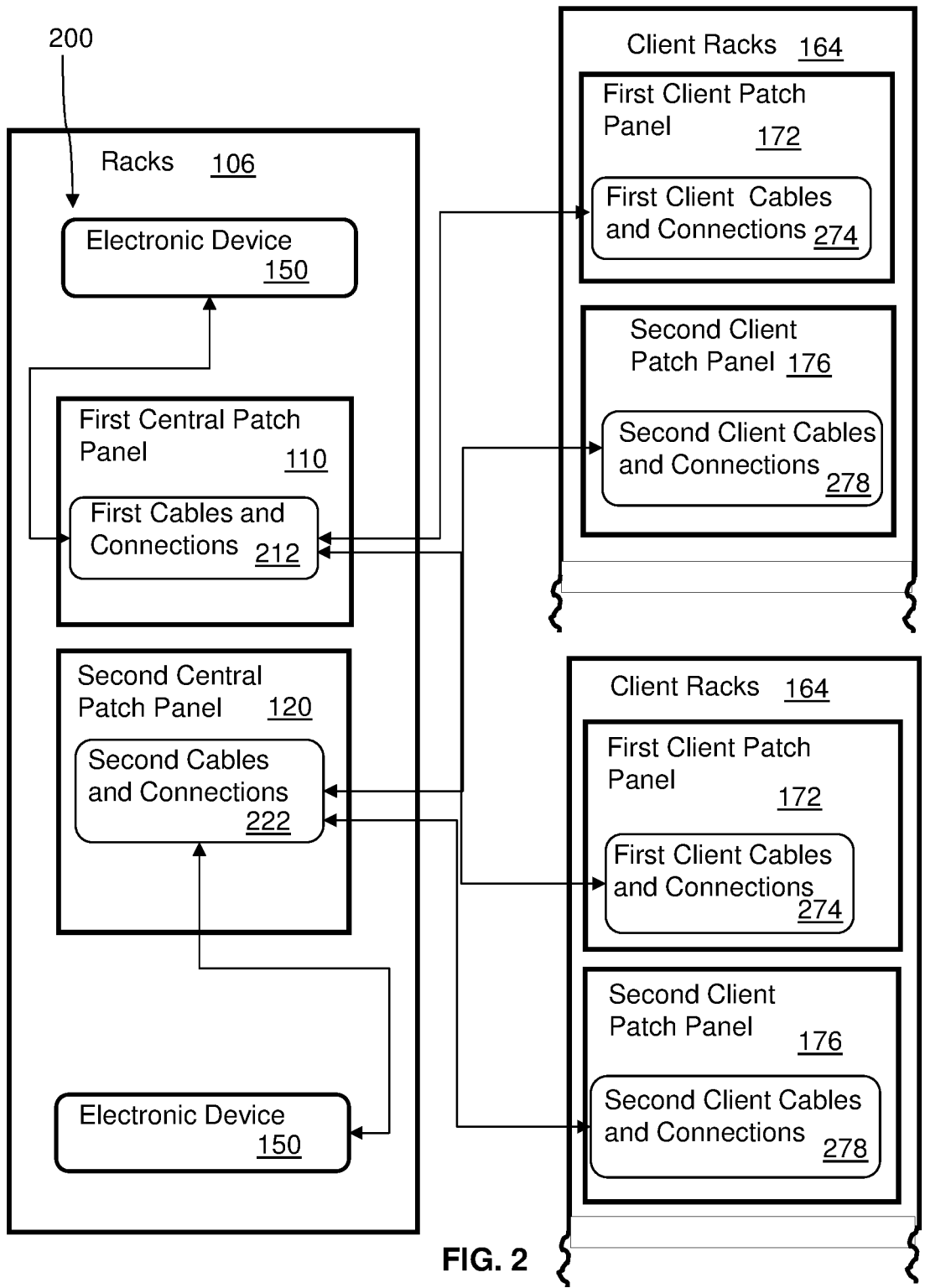
FIG. 2 is a rear elevational view of the custom electronic data center cabinet layout as a system, shown in FIG. 1, including system features or components, according to an embodiment of the present disclosure.

Referring to FIGS. 1 and 2, an apparatus or system 100 for assembling, and thereby providing a pre-assembled unit, of a central electrical cabinet unit for installation as a pre-assembled unit at a client site for designing/building a custom electronic data center cabinet design or layout. The apparatus or system 100 includes a central patch panel in a central cabinet for electronic devices, for example a first central patch panel 110 situated centrally in the rack 106 in a central patch panel area 112 which includes specified connections for components using the specified connections. For example, first cables and connections 212 (shown in FIG. 2) are shown in a back part 200 of the rack 106. In one example, a second central patch panel 120 is situated centrally in the rack 106 in the central patch panel area 112 and includes specified connections for components using the specified connections. For example, second cables and connections 222.

The apparatus 100 includes central patch panel connecting cables with central patch panel connectors including reciprocal connectors connectible to client specified connections in a client cabinet. For example, a first central patch panel 110 includes first cables and connections 212. In one example, a second central patch panel 120 includes second cables and connections 222.

The apparatus can include power cables and electrical cables with electrical connections to the central patch panel. For example, such power cables and electrical cables are including in the first cables and connections 212 and second cables and connections 222.

The apparatus includes the electrical cables having reciprocal connectors connectable to compatible client electrical connectors on client electrical cables in the client cabinet. Thereby the central patch panels in the central cabinet are a pre-assembled unit for installation at a client site and for connecting client cabinets thereto.

With further reference to FIGS. 1 and 2, the apparatus further includes a number of client cabinets 160 for electronic devices. The client cabinets 160 shown in FIG. 2 are representative of a number of client cabinets. The client cabinets include one or more client patch panels at a top area 174 of each of the number of client cabinets. For example, the client cabinets 160 can include client racks 164 which include a first client patch panel 172 and a second client patch panel 176. The first and second patch panels are located in the top area 174 of the client cabinet 160.

The apparatus 100 includes in each of the client cabinets, client specified connecting cables with the client specified connections, respectively, being connectible to the reciprocal connections of the connecting cables of the central patch panel. In each of the client cabinets, the client electrical cables with the compatible client electrical connectors being electrically connectable to the reciprocal connectors of the electrical cables connected to the central patch panel. For example, the client racks 164 can include first client cables and connection 274 in the first client patch panel 172, as shown in FIG. 2. Similarly, for example, the client racks 164 can include a second client patch panel 176 having second client cables and connection 278. The first and second connections connect to reciprocal connectors of the first and second connections of the first and second central patch panels, respectively.

OTHER EMBODIMENTS AND EXAMPLES

In another example, for a plurality of patch panels, a plurality of central patch panels, the plurality of central patch panels can include a first patch panel including a specified connection for components using the first specified connection and a second specified connection for components using the second specified connection. A central patch panel can include connecting cables with central patch panel connectors including reciprocal connectors connectible to a client first specified connections and a client second specified connections in a client cabinet.

Figure 4:
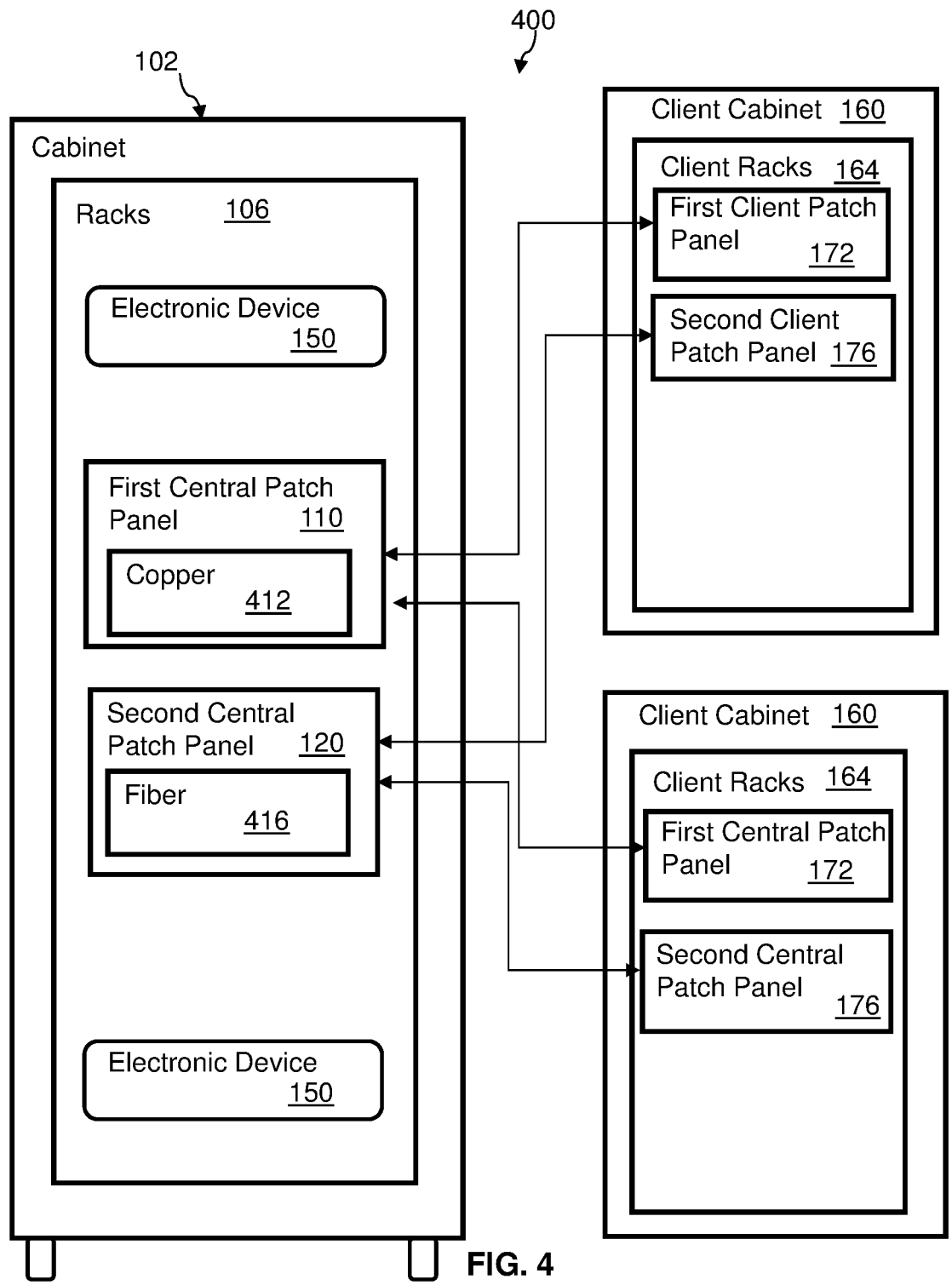
FIG. 4 is a front elevational view of another embodiment of a custom electronic data center cabinet layout as a system including system features or components, for assembling a central electrical cabinet unit for installation as a pre-assembled unit at a client site for designing/building a custom electronic data center cabinet design or layout, according to an embodiment of the present disclosure.
Figure 5:
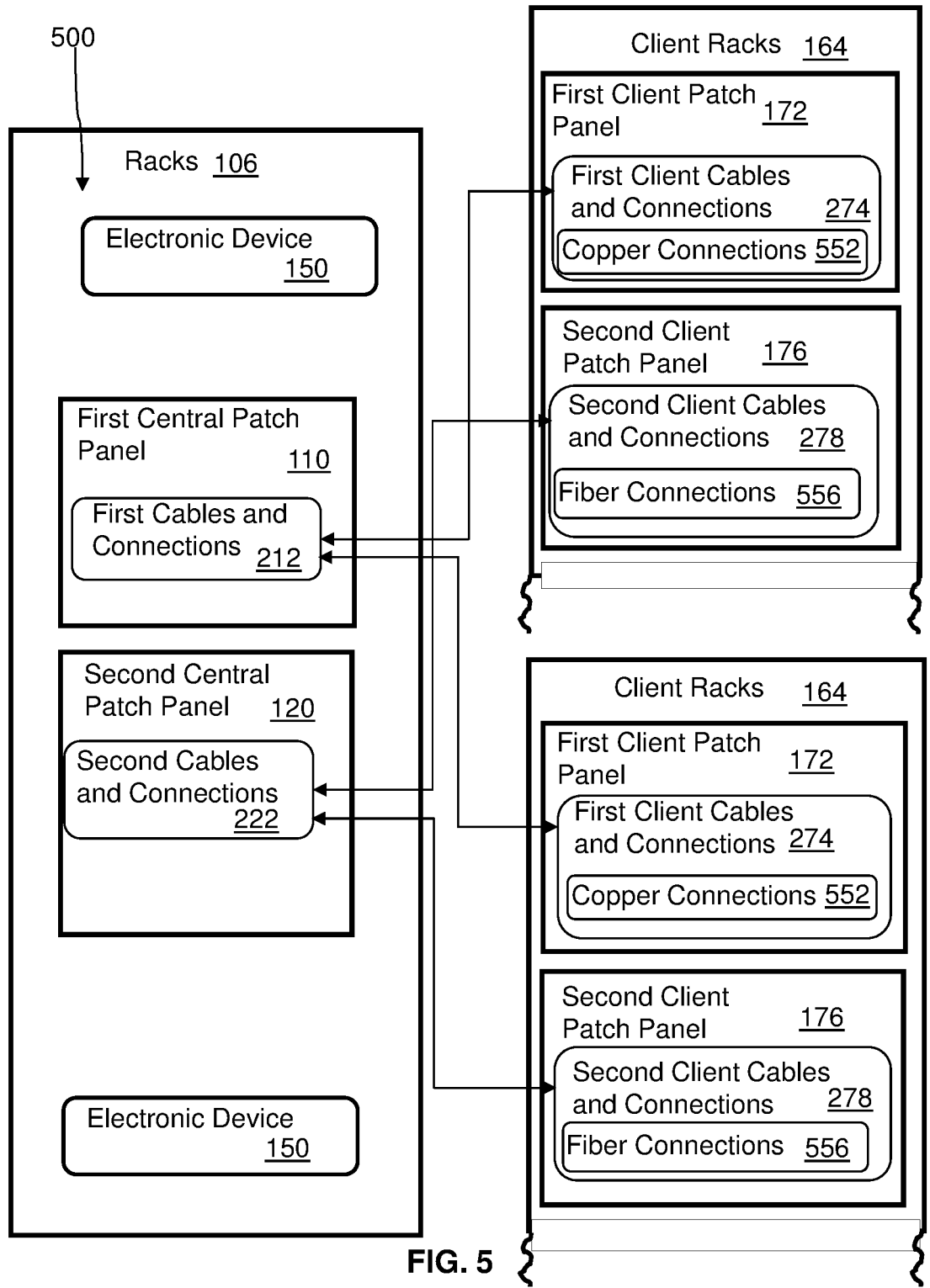
FIG. 5 is a rear elevational view of the custom electronic data center cabinet layout as a system, shown in FIG. 4, including system features or components, according to an embodiment of the present disclosure.

Referring to FIGS. 4 and 5, in another example, the apparatus or system 400 can include a plurality of central patch panels, shown in a rear part 500 of the rack 106. The plurality of central patch panels include a first patch panel 110 including a copper connection 552 (shown in FIG. 5) (shown in a rear part of the rack 106), for components using copper transmission, and a second patch panel including fiber connections 556 (shown in FIG. 5) for components using fiber transmission. And, central patch panel connecting cables with central patch panel connectors include reciprocal connectors connectible to a client fiber connection and client copper connection in a client cabinet. Such cables and connectors generically shown as first cables and connections 212 and second cables and connections 222.

In another example, the apparatus can include a number of client cabinets for electronic devices, as represented by client cabinets 160, as shown in FIGS. 1 and 4. The client cabinets can include electrical cables with connectors being electrically connectable to the reciprocal connectors of the central cabinet. One or more client patch panels are located at a top area 174 of each of the one or more client cabinets. The client patch panels can include a fiber patch panel including fiber connections for components using fiber transmission, and a copper patch panel including copper connections for components using components using copper transmission. Each of the client patch panels can include reciprocal electrical transmission cables being connectable to the reciprocal connectors of the central path panel connectors in the central cabinet.

In another example, the apparatus can include the central patch panels in pairs including a first set of central patch panels for fiber connections for components using fiber transmission, and a second set of central panels for copper connections for components using copper transmission.

Additionally, the central patch panel connecting cables include central patch panel connectors including reciprocal connectors connectible to a client fiber connection and client copper connection in a client cabinet.

In another example, a number of client cabinets for electronic devices, as represented by client cabinets 160, can have electrical cables with connectors being electrically connectable to the reciprocal connectors of the central cabinet. The client cabinets can include a set of client patch panels at a top area 174 of each of the client cabinets. The set of the client patch panels can include a fiber patch panel for components using fiber transmission, and a copper patch panel for components using components using copper transmission. Each of the set of client patch panels can include reciprocal electrical transmission cables being connectable to the reciprocal connectors of the central path panel connectors in the central cabinet.

In another example, the central cabinet can be installed at a client site. The client cabinets can be installed in proximity to the central cabinet, and the client cabinets can be electrically connected to the central cabinet.

In another example, in the one or more client patch panels, electrical power cables with connections are connectable to an on-site power source.

In another embodiment and example according to the disclosure, an assembled central electrical cabinet unit is a pre-assembled unit for installation at a client site, The pre-assembled unit if for designing/building the custom electronic data center cabinet design or layout which implements a geographically dispersed cloud optimized design. The central patch panel cabinet has cables and power strips pre-installed, and the central patch panel cabinet can have multiple central patch panels. The pre-assembled unit can further include custom labeling and mounting cables to the central patch panel cabinet. The pre-assembled unit can include a designated network central patch panel of the multiple central patch panels. A SAN (Storage Area Network) central patch panel can be designated of the multiple central patch panels. Two rows of cabinets can be provided, and the two rows of cabinets ach include a defined number of cabinets in each row up to eight client cabinets. The network central patch panel includes in a first row of cabinets which includes the SAN central patch panel in a designated row of cabinets. In the number of the client cabinets, two top of the cabinet patch panels to support up to 48 copper connections back to the network central patch panel of the central patch panel cabinet and 48 fiber connections back to the SAN central patch panel of the central patch panel cabinet can be installed. Thereby, the pre-assembled unit provides for a unique geographically dispersed cloud optimized design central patch panel which enables clients to have low-density equipment in one area and high-density equipment in another area.

In another embodiment according to the present disclosure, a kit includes a pre-assembled central electrical cabinet unit for installation at a client site for designing/building a custom electronic data center cabinet design or layout. The kit includes a central patch panel in a central cabinet for electronic devices, and the central patch panel includes specified connections for components using the specified connections. Central patch panel connecting cables with central patch panel connectors include reciprocal connectors connectible to client specified connections in a client cabinet. Power cables and electrical cables with electrical connections are connectible to the central patch panel. The electrical cables have reciprocal connectors connectable to compatible client electrical connectors on client electrical cables in the client cabinet. Thereby the central patch panels in the central cabinet are a pre-assembled unit for installation at a client site and for connecting client cabinets thereto. A number of client cabinets for electronic devices have electrical cables with connectors electrically connectable to the reciprocal connectors of the central cabinet. One or more client patch panels at a top area of each of the one or more client cabinets include specified connections for components using the specified connections. Each of the one or more client patch panels include electrical transmission cables having reciprocal electrical connections which are connectable to the reciprocal connectors of the central path panel connectors in the central cabinet.

Referring to FIGS. 1, 2 and 3A, in one embodiment according to the present disclosure, a computer-implemented method 300 for assembling a central electrical cabinet unit for installation as a pre-assembled unit at a client site for designing/building a custom electronic data center cabinet design or layout. The pre-assembled unit can be implemented as a geographically dispersed cloud optimized design which includes a series of operational blocks for implementing an embodiment according to the present disclosure. The method 300 includes, for example, assembling a central patch panel 110 in a cabinet 102, which can be a central cabinet, for electronic devices 150, the central patch panel includes specified connections for components using the specified connections, as in block 304. Electronic devices 150 generically represent electronic devices, for example, a server, a router, or a switch.

The method 300 can include installing central patch panel connecting cables with central patch panel connectors 212 including reciprocal connectors connectible to client specified connections of respective client specified connection cables 274 in a client cabinet 164, as in block 308.

The method 300 includes installing power cables and electrical cables with electrical connections to the central patch panel, as in block 312.

The method 300 includes configuring the electrical cables to have reciprocal connectors connectable to compatible client electrical connectors on client electrical cables in the client cabinet, thereby the central patch panels in the cabinet are a pre-assembled unit for installation at a client site and for connecting client cabinets thereto, as in block 316.

FURTHER EMBODIMENTS AND EXAMPLES

Referring to FIG. 3B with reference to FIG. 3A, in another embodiment according to the present disclosure, an alternative method 350 can begin at block 304 of the method 300 shown in FIG. 3A. The method 350 can proceed to block 354 where the method 350 can include installing the central patch panels in pairs including a first set of central patch panels for fiber connections for components using fiber transmission, and a second set of central panels for copper connections for components using copper transmission.

The method 350 includes installing the central patch panels connecting cables with central patch panel connectors including reciprocal connectors connectible to client specified connections of respective client specified connection cables in a client cabinet.

Thereafter, the method 350 includes continuing to block 312 of FIG. 3A.

ADDITIONAL EMBODIMENTS AND EXAMPLES

In one example, the method 300 can include assembling a number of client cabinets for electronic devices by installing one or more client patch panels at a top area of each of the number of client cabinets. The method can continue by installing, in each of the client cabinets, client specified connecting cables with the client specified connections, respectively, being connectible to the reciprocal connections of the connecting cables of the central patch panel. The method can include installing, in each of the client cabinets, the client electrical cables with the compatible client electrical connectors being electrically connectable to the reciprocal connectors of the electrical cables connected to the central patch panel.

In another example, the method 300 can include assembling a plurality of central patch panels in the central cabinet, the plurality of central patch panels can include a first patch panel including a first specified connection for components using the first specified connection and a second specified connection for components using the second specified connection. The method 300 can include installing central patch panel connecting cables with central patch panel connectors for the first specified connection and for the second specified connection. The central patch panel connectors can include reciprocal connectors connectible to a client first specified connection and a client second specified connection in a client cabinet.

In another example, the method 300 can include assembling a plurality of central patch panels in the central cabinet. The plurality of central patch panels can include a first patch panel including a fiber connection for components using fiber transmission, and a second patch panel including a copper connection for components using copper transmission. The method can include installing central patch panel connecting cables with central patch panel connectors for the fiber connection and for the copper connection. The central patch panel connectors can include reciprocal connectors connectible to a client fiber connection and client copper connection in a client cabinet.

MORE EMBODIMENTS AND EXAMPLES

Figure 3:
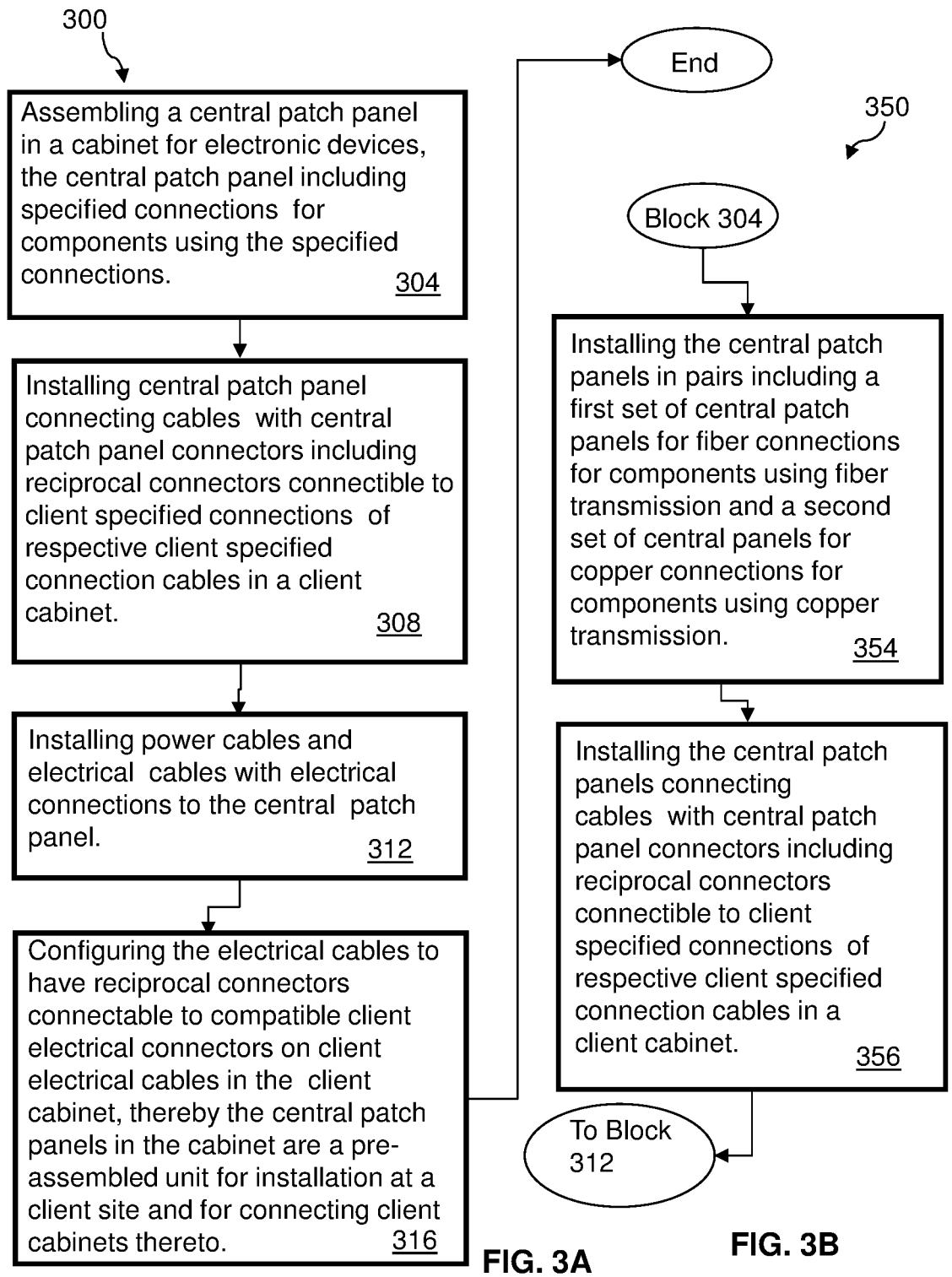
FIG. 3A is a flow chart illustrating a method, for assembling a custom electronic data center cabinet layout including a central electrical cabinet unit for installation as a pre-assembled unit at a client site for designing/building a custom electronic data center cabinet design or layout, according to an embodiment of the present disclosure.
FIG. 3B is another flow chart illustrating another method, according to an embodiment of the present disclosure, for assembling a custom electronic data center cabinet layout, which is a variation extending from the flow chart shown in FIG. 3A.

Referring to FIGS. 1, 3 and 4, in one embodiment according to the present disclosure, a method for assembling a central electrical cabinet unit for installation as a pre-assembled unit at a client site for designing/building a custom electronic data center cabinet design or layout.

The present disclosure provides a method for assembling a central electrical cabinet unit for installation as a pre-assembled unit at a client site for designing/building a custom electronic data center cabinet design or layout.

The present disclosure solves the problems of lengthy design cycles and inaccurate quote development for a custom client data center cabinet delivery. Using the techniques of the present invention, a custom client data center cabinet delivery can be provided without a length design cycle and with accurate cost quotes, thus providing competitive bidding and timely delivery.

The present disclosure includes data center modules and a method of large-scale deployment which includes assembling a pre-assembled unit for installation at a client site for designing/building a custom electronic data center cabinet design or layout. The data center cabinet design or layout implements a geographically dispersed cloud optimized design.

The present disclosure, as embodied in a geographically dispersed cloud optimized design provides a modular approach to design remotely placed cloud optimized design cabinets connected to a central patch panel. A system and method of the present disclosure can include modular building blocks, and components required to implement a client installation. In one embodiment, a single price for cabinets, cabling, power strips, cable trays, and cold isle containment, if required, can be included and provided to a client, using the system and method of the present disclosure. Such an all-in-one solution can be more efficiently and rapidly priced, thus improving time for development, and upon signing of a contract, time for delivery. Since a solution as in the embodiment of the present disclosure are all inclusive, the true cost for implementation is identified, with minimal risk of requiring contingency funding for missing components.

Using embodiments of the present disclosure with a Central Patch Panel, multiple cabinets can be deployed within a data center. In one embodiment according to the present disclosure, a modular data center approach can be implemented to building various density solutions for quick deployment of cabinets on the data center floor. The embodiments of the present disclosure provide a turn-key data center in a box design.

Elements of the apparatus and system 400 shown in FIGS. 4 and 5 may be similar to elements of the apparatus and system 100 shown in FIGS. 1 and 2. The apparatus and system in FIGS. 4 and 5 is intended as another example embodiment which can include aspects/operations shown and discussed previously in the present disclosure.

Referring to FIGS. 4 and 5, in one embodiment according to the present disclosure, a geographically dispersed cloud optimized design cabinet system 400 includes a main cabinet embodied as a central patch panel cabinet 102 with multiple client cabinets 160. The cabinet 102 include a first central patch panel 110 for copper (CAT-6 (category 6)) connections 412, and a second central patch panel 120 for fiber connections 416, both OM4 (optical mode 4) type and 9 micron type. Each client cabinet 160 contains top of rack copper and fiber patch panels embodied as first client patch panel 172 for copper connections, and second client patch panel 176 for fiber connections. The system 400, also referred to as a solution, is delivered with all cabling pre-installed and tested. Thereby, the system reduces on-site labor, while improving quality with an end to end tested solution. Further, the system provides the ability to interconnect multiple system building blocks to a cabinet central patch panel.

Two client cabinets are shown in FIG. 5 as exemplary, and not as a limitation. Numerous client cabinets can be connected to the cabinet, and such is discussed in more detail below.

The system 400 is designed around the central patch panel cabinet 102 with cables and power strips pre-installed. The cables can be custom labeled and shipped mounted to the central patch panels 110, 120. In the present embodiment, one central patch panel for a network, and one central patch panel for SAN (Storage Area Network). For example, the first central patch panel 110 is for a network using copper connections and cabling, and the second central patch panel 120 is for SAN using fiber connections and cabling.

The system 400 using the central patch panel design as described above enables clients to have low density equipment in one area and high-density equipment in another area.

In one embodiment, the system can be designed with two rows of client cabinets. Each row of client cabinets can contain up to eight client cabinets. For example, the client cabinets 160. In another example, a 00 Row can be a network row with cabinet 00 containing the central network patch cabinet, with all network cables in the system in 00.

The central network patch can have the capacity to install and power two network switches to reduce jumper cables required. Jumper cables can have a minimal length (for example, less than 4 feet) for central patch connections. The 10 row can be the SAN Row with cabinet 10 containing the central SAN patch cabinet with all SAN Cables in the system originating in 10. The central SAN patch can have the capacity to install and power two SAN switches to reduce jumper cables required. Jumper cables can have a minimal length (for example, less than 4 feet) for central patch connections. Rows 00 and rows 10 can face each other and can be capped by cold isle doors on either end if required. A total of 16 server cabinets, plus two central patch cabinets in a maximum configuration. At a minimum, two central patch cabinets are used, required, with incremental growth of two cabinets up to the maximum configuration of 16 server cabinets.

The server cabinets have two preinstalled top of cabinet patch panels to support up to 48 copper back to a central patch, and 48 fiber back to a central patch. For example, client cabinet 360 includes a first client patch panel 372 and a second client patch panel 376. The first client patch panel 172 includes first client cables and connection 274, which can be copper client cables and connections, connectible to the first central patch panel 110 via the first cables and connections 274, as shown in FIGS. 4 and 5. The second client patch panel 176 includes second client cables and connections 278, which can be fiber client cables and connection, connectible to the second central patch panel 120 via second cables and connections 222.

In one example, storage devices can be installed outside the system and can have under floor posts mounted patch panels with provisions for up to 48 fiber and 48 copper leading back to a central patch panel. Cabinet power density can be capped at 17 KW (Kilowatt) (60 Amp) per cabinet or 300 KW for the system. As a result of the embodiments of the present disclosure, time to delivery can be improved and costs reduced by the system as in the embodiments of the present disclosure, for example, having a patch cable at the client cabinet due to the SAN (Storage Area Network) and Network Switch being installed in the central patch panel with all connections installed at a system build time.

Embodiments of the present disclosure provide for connecting two physically separated systems utilizing a central patch panel design, providing geographically dispersed cloud optimized design patch panels. The system includes the central patch panel cabinets and client cabinets, respectively. The system includes cabling, power, and cabinets to support client installations. The system can be implemented for clients that require two different power densities to insure sufficient cooling of installed equipment.

In one example of two different power densities, a first area can have a low power density solution limited to 5 KW (Kilowatt) cabinets, and a second area can include a high-density solution limited to 17 KW cabinets. Utilizing this approach, sufficient cooling can be implemented while maximizing the efficiency of the data center.

In one example, central patch panels can be installed in pairs for redundancy. One pair for fiber (e.g., cables and connections), and one pair for CAT(Category)-6 (copper) (e.g., cables and connections). The central patch can be powered for the installation of client SAN(Storage Area Network)/LAN (Local Area Network) Switches.

Systems according to the present disclosure can include a central patch panel design which provides one rack space for each client cabinet. The client cabinets are connected to the central patch for connectivity to enable the client to install equipment as they choose. These are pre-fabricated and installed at the factory. The cabinets can be shipped to the site for quick deployment. The central patch panel cabinet 302 can be shipped to the site fully assembled, populated, and tested with all cables and power strips installed.

Each client cabinet 160 can be installed with two patch panels for fiber and two patch panels for copper. These patch panels can be tested at the factory.

In one example, with reference to Table 1, a client can request a 270 KW solution. The system can include 460C9W (60) amp power strips, at 17 KW each with 48 OM (Optical Multi-Mode) 4 and 48 CAT (Category)-6 cables back to each central patch panel. The system of this example can provide up to 24 cabinets.

TABLE 1

Table 1 shows system design parameters.

| | | | COD Quick Look Up Table | | | | | | | | | | XFER | KW |
|---|---|---|---|---|---|---|---|---|---|---|---|---|---|---|
| | | | OM4 | | | A | CAT-6 | | | | | | 3000,000 | 270 |
| 208V | AMP | KW | A | B | Total | Trunks | A | B | Total | Tunks | Panel | Panel | 225 | 72.95 |
| L6-30 | 30 | 4.99 | 12 | 12 | 24 | 1 | 24 | 24 | 48 | 3 | 14 | 14 | 3.21 | Average KW |
| L15-30 | 30 | 8.65 | 24 | 24 | 48 | 2 | 32 | 32 | 64 | 4 | 8 | 48 | 5.63 | Average KW |
| CS8369 | 50 | 14.41 | 36 | 36 | 72 | 3 | 40 | 40 | 80 | 5 | 5 | 30 | 9.00 | Average KW |
| 460C9W | 60 | 17.29 | 48 | 48 | 96 | 4 | 48 | 48 | 96 | 6 | 4 | 24 | 11.25 | Average KW |
| 80 A | 80 | 23.06 | 96 | 96 | 192 | 8 | 96 | 96 | 192 | 12 | 3 | 18 | 15.00 | Average KW |
| L5-20 | 20 | 1.92 | | | | | | | | | 37 | 222 | 1.216216 | |

| Cabinets | OM4 | CAT-6 | Solution | | |
|---|---|---|---|---|---|
| 4.99 | 24 | 48 | 84 | Cabinets | |
| 8.65 | 48 | 64 | 48 | Cabinets | |
| 14.41 | 72 | 80 | 30 | Cabinets | |
| 17.29 | 96 | 96 | 24 | Cabinets | Optimum |
| 23.06 | 192 | 192 | 18 | Cabinets | |

Systems and methods according to present disclosure enable installing a custom data center cabinet layout and design as a pre-assembled unit ready for installation at a client, in contrast to custom building a cabinet system at a client site. In the embodiments of the present disclosure, cable lengths can be standardized and labeled, and also bundled together before transporting the system to a client site. This is in contrast to measuring and custom ordering cables, and grouping and labeling and bundling cables together at a client site.

The embodiments of the present disclosure provide utilizing a standard design and manufacturing the system of cabinets offsite, and delivering the system fully tested. The cables and labels can be tested and verified. Using the systems and methods of the present disclosure, client installation time can be reduced by several weeks. Further, the present disclosure provides systems and solutions to optimize the power for each cabinet by limiting the power demand by the number of connections of fiber or copper installed in the cabinet. This process can be repeated and creates uniformity in the data center.

Embodiments of the present disclosure provide a modular data center approach to building a various density solution for quick deployment of cabinets on the data center floor. The disclosure provides a turn-key data center in a box design including a central patch panel cabinet with multiple client cabinets. There can be one central patch panel for copper CAT-6 and one central patch panel for fiber, both OM (Optical Multi-Mode)4 and 9 micron fiber cables. Each client cabinet contains top of rack copper and fiber patch panels. The solution is delivered with all the cabling pre-installed and tested, reducing on site labor, while improving quality with an end to end tested solution. The systems of the present invention can be described as a Geographically Dispersed Cloud Optimized Design (GDCOD) and provide the ability to interconnect multiple COD (Cloud Optimized Design) building blocks to a central GDCOD patch panel.

FURTHER DISCUSSION REGARDING EXAMPLES AND EMBODIMENTS

It is understood that a set or group is a collection of distinct objects or elements. The objects or elements that make up a set or group can be anything, for example, numbers, letters of the alphabet, other sets, a number of people or users, and so on. It is further understood that a set or group can be one element, for example, one thing or a number, in other words, a set of one element, for example, one or more users or people or participants.

The descriptions of the various embodiments of the present invention have been presented for purposes of illustration, but are not intended to be exhaustive or limited to the embodiments disclosed. Likewise, examples of features or functionality of the embodiments of the disclosure described herein, whether used in the description of a particular embodiment, or listed as examples, are not intended to limit the embodiments of the disclosure described herein, or limit the disclosure to the examples described herein. Such examples are intended to be examples or exemplary, and non-exhaustive. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method for assembling a central electrical cabinet unit for installation as a pre-assembled unit at a client site for designing/building a custom electronic data center cabinet design or layout, comprising:

assembling multiple central patch panels in a central patch panel cabinet for electronic devices, each of the central patch panels including specified connections for components using the specified connections;

installing central patch panel connecting cables with central patch panel connectors including reciprocal connectors connectible to client specified connections of respective client specified connection cables in a client cabinet;

installing power cables and electrical cables with electrical connections to each of the multiple central patch panels;

configuring the electrical cables to have reciprocal connectors connectable to compatible client electrical connectors on client electrical cables in the client cabinet, thereby the central patch panels in the central patch panel cabinet is a pre-assembled unit for installation at a client site and for connecting client cabinets thereto;

designating at least one of the multiple central patch panels that supports copper connections as a network central patch panel; and designating at least one of the multiple central patch panels that supports fiber connections as a storage area network (SAN) central patch panel, wherein the assembled central electrical cabinet unit is a pre-assembled unit for installation at the client site for designing/building the custom electronic data center cabinet design or layout which implements a geographically dispersed cloud optimized design, and wherein the central patch panel cabinet has cables and power strips pre-installed; the method further comprising:

custom labeling and mounting cables to the central patch panel cabinet;

providing two rows of cabinets;

defining a number of cabinets in each row up to eight client cabinets;

including the network central patch panel in a first row of cabinets;

including the SAN central patch panel in a designated row of cabinets; and preinstalling, in the number of the client cabinets, two top of the cabinet patch panels to support up to 48 copper connections back to the network central patch panel of the central patch panel cabinet and 48 fiber connections back to the SAN central patch panel of the central patch panel cabinet, for a unique geographically dispersed cloud optimized design central patch panel which enables clients to have low density equipment in one area and high density equipment in another area.

* * * * *